United States Patent
Nakamura et al.

(10) Patent No.: US 6,313,534 B1
(45) Date of Patent: Nov. 6, 2001

(54) OHMIC ELECTRODE, METHOD AND MULTI-LAYERED STRUCTURE FOR MAKING SAME

(75) Inventors: Mitsuhiro Nakamura, Tokyo; Mitsumasa Ogura; Masanori Murakami, both of Kyoto, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/273,272

(22) Filed: Mar. 22, 1999

(30) Foreign Application Priority Data

Mar. 25, 1998 (JP) .................................................. 10-077201

(51) Int. Cl.[7] .......................... H01L 23/48; H01L 23/52; H01L 29/40
(52) U.S. Cl. .......................... 257/745; 257/13; 257/748; 257/763; 257/750; 257/766; 257/775
(58) Field of Search ................................. 438/604, 597, 438/602, 606, 648, 656, 605, 607; 257/102, 103, 96, 13, 81, 85, 78, 745, 748, 763, 766, 775

(56) References Cited

U.S. PATENT DOCUMENTS

| | | | |
|---|---|---|---|
| 4,626,322 | * | 12/1986 | Switzer .................................. 204/2.1 |
| 5,015,596 | * | 5/1991 | Toyoda et al. .......................... 437/41 |
| 5,045,502 | * | 9/1991 | Lau et al. .. | |
| 5,179,041 | * | 1/1993 | Yano et al. ............................ 437/184 |
| 5,229,323 | * | 7/1993 | Shimada et al. ....................... 437/176 |
| 5,387,549 | * | 2/1995 | Kobayashi ............................ 437/184 |
| 5,652,434 | * | 7/1997 | Nakamura et al. ..................... 257/13 |
| 5,747,878 | * | 5/1998 | Murakami et al. ................... 257/745 |
| 5,904,554 | * | 5/1999 | Uchibori et al. ...................... 438/604 |
| 6,033,976 | * | 3/2000 | Murakami et al. ................... 438/602 |
| 6,093,965 | * | 7/2000 | Nakamura et al. ................... 257/749 |
| 6,204,512 | * | 3/2001 | Nakamura et al. ..................... 257/13 |

FOREIGN PATENT DOCUMENTS

| | | | | |
|---|---|---|---|---|
| 58-052876 | * | 3/1983 | (JP) | ............................... H01L/29/80 |
| 36205447 | * | 3/1987 | (JP) | ............................... H01L/29/80 |

\* cited by examiner

*Primary Examiner*—Matthew Smith
*Assistant Examiner*—V. Yevsikov
(74) *Attorney, Agent, or Firm*—Sonnenschein, Nath & Rosenthal

(57) ABSTRACT

To realize an ohmic electrode having practically satisfactory characteristics relative to GaAs semiconductors, first formed on an $n^+$-type GaAs substrate are a Ni thin film with a thickness between 8 nm and 30 nm, an In thin film with a thickness between 2 nm and 6 nm and a Ge thin film with a thickness between 10 nm and 50 nm, sequentially. After that, the $n^+$-type GaAs substrate having formed the Ni thin film, In thin film and Ge thin film is annealed at a temperature between 300 to 600° C. for a few seconds to minutes. As a result, the ohmic electrode has a multi-layered structure including an $n^{++}$-type re-grown GaAs layer re-grown from the $n^+$-type GaAs substrate, InGaAs layer and NiGe thin film. Alternatively, before the annealing, a thin film of a refractory metal or its compound, such as Nb thin film, with or without another thin film of a wiring metal, such as Au thin film, may be further formed on the Ge thin film.

31 Claims, 10 Drawing Sheets

OHMIC ELECTRODE, METHOD AND MULTI-LAYERED STRUCTURE FOR MAKING SAME

RELATED APPLICATION DATA

The present application claims priority to Japanese Application No. P10-077201 filed Mar. 25, 1998 which application is incorporated herein by reference to the extent permitted by law.

BACKGROUND OF THE INVENTION

1. Field of the Invention

This invention relates to an ohmic electrode, method for making same and multi-layered structure for making same, and particularly relates to an ohmic electrode for a III–V compound semiconductor base body.

2. Description of the Related Art

To grade up the performance and improve the reliability of a device, such as FET, using compound semiconductors, reduction of contact resistance and improvement of thermal stability of its ohmic electrode are important issues. Heretofore, however, as to ohmic electrodes for compound semiconductors, especially such as GaAs semiconductors and other III–V compound semiconductors, there has been proposed none that satisfies the above-mentioned requirements.

Ohmic electrodes currently brought into practical use or under proposal can be roughly classified into three groups. In first group ohmic electrodes, used as their ohmic metals are materials containing an element behaving as a donor impurity relative to GaAs semiconductors. Then, the ohmic electrode are made by annealing the material to have the element diffuse into a semiconductor to form an n-type region with a high impurity concentration along the boundary between an electrode metal and the semiconductor and make an ohmic contact by tunneling effect, for example. In second group ohmic electrodes, used as their ohmic electrodes are materials containing an element which makes an intermediate layer with a low energy barrier. Then, the ohmic electrodes are made by annealing the materials to form such an intermediate layer with a low energy barrier between the electrode metal and the semiconductor to lower the energy barrier in the portion where carriers flow, thereby to make an ohmic contact. In third group ohmic electrodes, used as their ohmic metals are materials containing an element which interacts with a GaAs semiconductor, when annealed, and forms a semiconductor re-grown layer, and another element which behaves as a donor impurity relative to GaAs. Then, the ohmic electrodes are made by annealing the materials to form a re-grown layer and change the re-grown layer into an n-type layer with a high impurity concentration, thereby to make an ohmic contact by tunneling effect, for example.

A representative example of first group ohmic electrodes is shown in FIGS. 1A and 1B. In this example, a AuGe/Ni thin film 102 is made as an ohmic metal on an n$^+$-type GaAs substrate 101 as shown in FIG. 1A, and it is annealed at 400° C. through 500° C. to form the ohmic electrode as shown in FIG. 1B. In FIG. 1B, reference numeral 103 denotes an n$^{++}$-type GaAs layer, and 104 denotes a layer containing a mixture of NiAs and β-AuGa.

However, the ohmic electrode shown in FIG. 1B is unsatisfactory in thermal stability. More specifically, since a plenty of Au contained in the AuGe/Ni film 102 as the ohmic metal (normally used AuGe contains 88% of Au) forms β-AuGa in the layer 104 by interaction with the n$^+$-type GaAs substrate 101 when annealed at a temperature of 400° C. or higher, the contact resistance of the ohmic electrode increases significantly. This induces deterioration of the device characteristics occurs upon a high-temperature process such as chemical vapor deposition (CVD) conducted after the ohmic electrode is made. Moreover, generation of β-AuGa by interaction between the n$^+$-type GaAs substrate 101 and Au in the AuGe/Ni thin film 102 makes a rough surface on the ohmic electrode, and this invites problems upon later micro processing.

The ohmic electrode shown in FIG. 1B involves another problem that it cannot cope with the requirements of reducing the thickness of the n$^{++}$-type GaAs layer 103 or microsizing FET or other devices. More specifically, the n$^{++}$-type GaAs layer 103, which is made by diffusion upon annealing, is determined in depth and lateral extension (extension parallel to the substrate) exclusively by the annealing temperature and time. Therefore, its depth and lateral direction cannot be controlled. As a result, it is difficult to reduce the thickness of the n$^{++}$-type GaAs layer 103 and the distance between ohmic electrodes.

Second group ohmic electrodes and third group ohmic electrodes were proposed to overcome the problems involved in the above-discussed first group ohmic electrode due to the use of AuGe/Ni thin film 102, namely, thermal instability of the ohmic electrode and roughness on the electrode surface.

A representative example of second group ohmic electrodes is shown in FIGS. 2A and 2B. In this example, a NiIn thin film 202 and a W thin film 203 as ohmic metals are stacked sequentially on an n$^+$-type GaAs substrate 101 as shown in FIG. 2A, and they are annealed at a high temperature around 900° C. for about one second to form the ohmic electrode as shown in FIG. 2B. In FIG. 2B, reference numeral 204 denotes an InGaAs (simplified expression of In$_x$Ga$_{1-x}$As throughout this application) layer, and 205 denotes Ni$_3$In thin film. In this case, the InGaAs layer 204 is made as an intermediate layer with a low energy barrier as a result of interaction between the n$^+$-type GaAs substrate 201 and In contained in the NiIn thin film 202 in the annealing process, and decreases the effective height of the energy barrier to make the ohmic contact. Since the ohmic electrode shown in FIG. 2B does not contain any refractory compound, such as β-AuGa contained in the first group ohmic electrode shown in FIG. 1B, it is reported that the contact resistance of the ohmic electrode is stable against annealing at 400° C. for 100 hours, approximately.

The ohmic electrode shown in FIG. 2B, however, needs high-temperature annealing around 900° C. to make the ohmic contact. Therefore, it cannot be used in devices, such as JFET (junction gate FET) and HEMT (high electron mobility transistor), which use gates and channels formed at a temperature lower than 900° C. Therefore, the ohmic electrode shown here has the problems that the process window is small and its applicability is limited to a few sorts of devices.

A representative example of third group ohmic electrodes is shown in FIGS. 3A and 3B. In this example, a Pd thin film 302 and a Ge thin film 303 are sequentially stacked as ohmic metals on an n$^+$-type GaAs substrate as shown in FIG. 3A, and they are annealed at 325° C. through 375° C. for 30 minutes, approximately, to form the ohmic electrode as shown in FIG. 3B. In FIG. 3B, reference numeral 304 denotes an n$^{++}$-type GaAs layer and 305 denotes a PdGe thin film. In this case, GaAs from the n$^+$-type GaAs substrate 301 makes a re-grown layer, and Ge from the Ge thin film 303 diffuses in the re-grown layer to form the n$^{++}$-type GaAs layer 304 and thereby makes the ohmic contact.

In the ohmic electrode shown in FIG. 3B, the thickness of the re-grown n$^{++}$-type GaAs layer 304 can be controlled by changing the thickness of the Pd thin film 302 and/or the Ge thin film 303. Therefore, it is possible to reduce the thickness of the n$^{++}$-type GaAs layer 304 and the distance between ohmic electrodes. However, the ohmic electrode shown here has a serious problem about its thermal stability.

Under the circumstances, the Inventor proposed a new method for making ohmic electrodes intended to overcome the problems contained in ohmic electrodes in first, second and third groups discussed above Japanese Patent Laid-Open Publication No. Hei 6-267887). FIGS. 4A and 4B illustrate this method. As shown in FIG. 4A, this method first makes a predetermined pattern of a Ni thin film 402, IN thin film 403 and Ge thin film 404 on an n$^+$-type GaAs substrate 401 as shown in FIG. 4A. In this case, thickness of the Ni thin film is 100 nm, thickness of the In thin film 403 is 3 nm, and thickness of the Ge thin film 404 is 100 nm. After that, the n$^+$-type GaAs substrate 401 having formed the Ni thin film 402, In thin film 403 and Ge thin film 404 thereon is annealed, for example, at 700° C. for several seconds to minutes, to make the ohmic electrode made up of an n$^{++}$-type regrown GaAs layer 405 regrown from the n$^+$-type GaAs substrate 401, InGaAs layer 406 and NiGe thin film 407 as shown in FIG. 4B. The ohmic electrode obtained in this manner has advantages: low contact resistance, no roughness on surfaces, and excellent thermal stability, and is much more excellent than the conventional ohmic electrodes.

However, the method for making ohmic electrodes shown in FIGS. 4A and 4B still involves some problems. The first problem is insufficient process windows in consideration of the annealing temperature for making ohmic electrodes being as high as 700° C. The second problem is that a large depth of interaction with the n$^+$-type GaAs substrate 401 upon making the ohmic electrode, and it is an issue for progressing micro-sizing of devices. The third problem occurs when Au is used as a wiring material in the case where the wiring connected to the ohmic electrodes is made after the ohmic electrode is made. Indium (In) in the ohmic electrode interacts with Au during later annealing, and may increase the contact resistance. So, it has been desired to realize ohmic electrodes which overcome these problems and have more satisfactory characteristics.

OBJECTS AND SUMMARY OF THE INVENTION

It is therefore an object of the invention to provide an ohmic electrode having practically more satisfactory characteristics relative to GaAs semiconductors and other III–V compound semiconductors used as a base body.

Another object of the invention is to provide a method for making an ohmic electrode and a multi-layered structure for making an ohmic electrode, which facilitate to make an ohmic electrode having practically more satisfactory characteristics relative to GaAs semiconductors and other III–V compound semiconductors used as a base body.

According to the invention, there is provided an ohmic electrode made by sequentially forming a Ni thin film with a thickness between 8 nm and 30 nm, an In thin film with a thickness between 2 nm and 6 nm and a Ge thin film with a thickness between 10 nm and 50 nm on a III–V compound semiconductor base body, and thereafter annealing the III–V compound semiconductor base body having formed the Ni thin film, In thin film and Ge thin film.

According to the invention, there is further provided a method for making an ohmic electrode comprising the steps of:

sequentially farming a Ni thin film with a thickness between 8 nm and 30 nm, an In thin film with a thickness between 2 nm and 6 nm and a Ge thin film with a thickness between 10 nm and 50 nm on a III–V compound semiconductor base body; and annealing the III–V compound semiconductor base body having formed the Ni thin film, In thin film and Ge thin film.

According to the invention, there is further provided a multi-layered structure for making an ohmic electrode, comprising a Ni thin film with a thickness between 8 nm and 30 nm, an In thin film with a thickness between 2 nm and 6 nm and a Ge thin film with a thickness between 10 nm and 50 nm which are sequentially formed on a III–V compound semiconductor base body.

In the present invention, the III–V compound semiconductor base body may be a substrate or a layer made of, for example, GaAs, AlGaAs, or InGaAs. The III–V compound semiconductor base body is typically of an n-type, but may be of a p-type.

In this invention, from the viewpoint of lowering the annealing temperature upon making the ohmic electrode and making the reaction depth shallower, thickness of each film is preferably determined as: not thinner than 10 nm and not thicker than 20 nm for the Ni thin film, not thinner then 3 nm and not thicker than 5 nm for the In thin film, and not thinner than 20 nm and not thicker than 40 nm for the Ge thin film. The annealing temperature is preferably in the range from 300° C. to 600° C. and more preferably in the range from 400° C. to 600° C.

In the present invention, from the viewpoint of preventing deposition of In onto the electrode surface and surface roughness, and also improving the surface morphology, or from the viewpoint of preventing interaction between In contained in the ohmic electrode and Au when using Au as the wiring connected to the ohmic electrode, the ohmic electrode is preferably made by making on the Ge thin film a thin film of a refractory metal or a refractory metal compound, preferably a refractory metal or a refractory metal compound whose melting point is as high as 800° C., and then annealing the III–V compound semiconductor base body having formed the thin film made up of a Ni thin film, In thin film, Ge thin film and refractory metal or refractory metal compound. That is, by using the thin film made of refractory metal or refractory metal compound as a diffusion preventing film (barrier metal film), out-diffusion of In during annealing is prevented. Furthermore, from the viewpoint of reducing the sheet resistance of the ohmic electrode while holding the effect obtained by the thin film made of the refractory metal or refractory metal compound, the ohmic electrode is preferably made by first making the thin film made of the refractory metal or refractory metal compound on the Ge thin film, additionally making thereon a thin film made of a metal or a metal compound, and annealing the III–V compound semiconductor base body having formed the thin film made up of the Ni thin film, In thin film, Ge thin film, and refractory metal or refractory metal compound, and the thin film made of the metal or the metal compound.

As the thin film made of a metal or a metal compound, preferably used is Al, Au, Cu or Al alloy (such as AlSi) having a low electrical specific resistance, which are generally used as a wiring material. In this case, although these wiring materials generally have low melting points, since the thin film of a metal or metal compound is made on the Ge thin film via the thin film of a refractory metal or a refractory metal compound, reaction during the annealing can be prevented. Usable as the refractory metal or refractory metal compound are, for example, W, Ta, Ti, Mo, and their compounds, particularly, nitrides (such as WN) or silicon compounds (such as $WSi_2$). As the thin film of a refractory metal or refractory metal compound, a Nb film is particularly excellent in effect of preventing diffusion of In. When a Ti thin film is further formed on the Nb thin film to form a two-layered structure, more excellent effect of preventing diffusion of In can be obtained, and the problems of undesirable deposition of In on the electrode surface and undesirable interaction with the upper-lying Au can be removed almost completely.

In the present invention, the thin film made up of the Ni thin film, In thin film, Ge thin film and refractory metal or refractory metal compound and the thin film of a metal or metal compound can be made by vapor deposition or sputtering, for example.

According to the invention having the above-summarized features, since both the Ni thin film and the Ge thin film used to form the ohmic electrode are as very thin as a half or less compared with conventional films, reaction required for making the ohmic electrode reliably occurs even when the annealing temperature for forming the ohmic electrode is set much lower than the conventional one, namely, as low as 600° C., for example, and the ohmic electrode can be made reliably. Since a low annealing temperature can be used, the depth of interaction with the III–V compound semiconductor base body can be made shallower. When the thin film of a refractory metal or refractory metal compound is made on the Ge thin film, undesirable deposition of In on the electrode surface and undesirable interaction between Au and In contained in the ohmic electrode can be prevented during annealing after the Au wiring connected to the ohmic electrode is made. Furthermore, when the thin film of a metal or metal compound with a low electrical specific resistance is made on the thin film of a refractory metal or refractory metal compound, the sheet resistance of the ohmic electrode can be reduced.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1A:
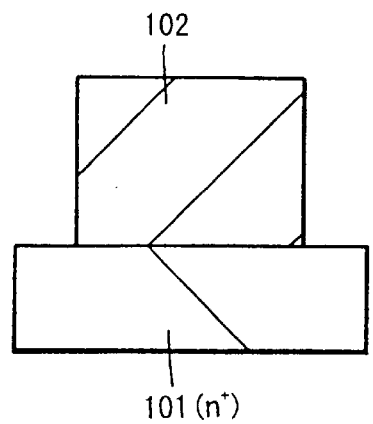
FIGS. 1A and 1B are cross-sectional views for explaining a conventional ohmic electrode.
Figure 1B:
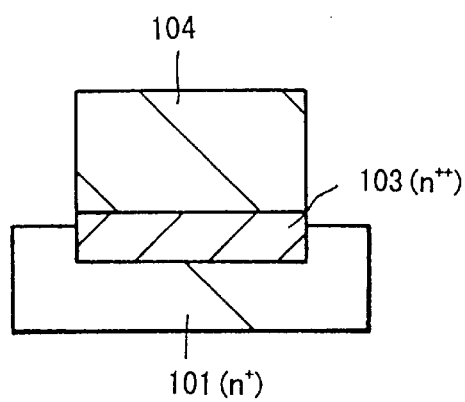
Figure 2A:
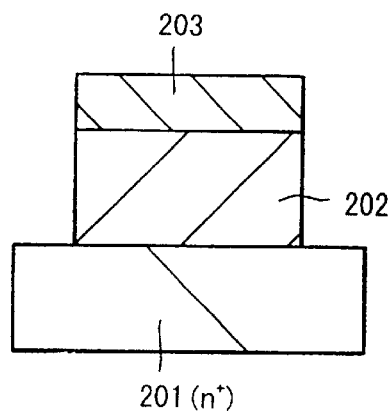
FIGS. 2A and 2B are cross-sectional views for explaining another conventional ohmic electrode.
Figure 2B:
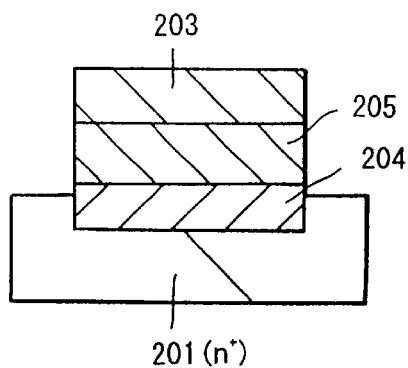
Figure 3A:
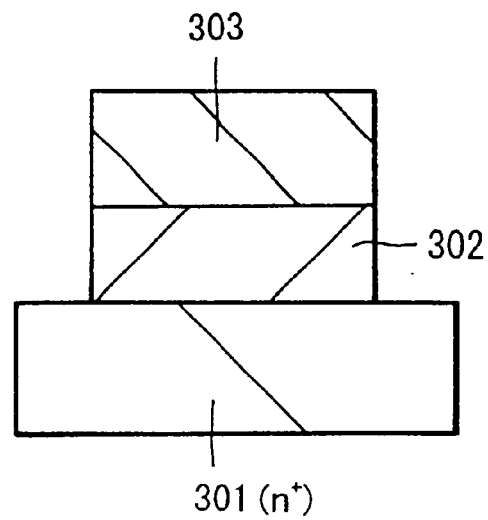
FIGS. 3A and 3B are cross-sectional views for explaining another conventional ohmic electrode.
Figure 3B:
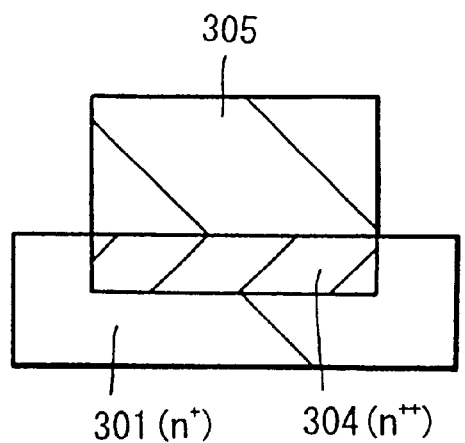
Figure 4A:
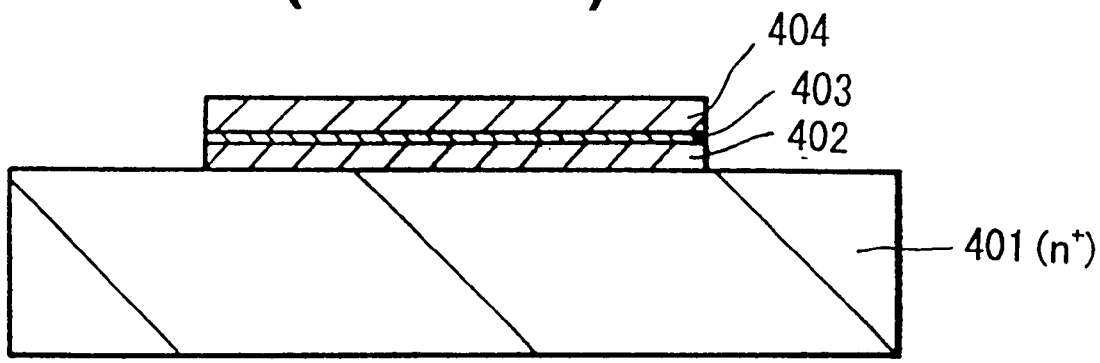
FIGS. 4A and 4B are cross-sectional views for explaining a method for making an ohmic electrode by an earlier proposal of the present Inventor.
Figure 4B:
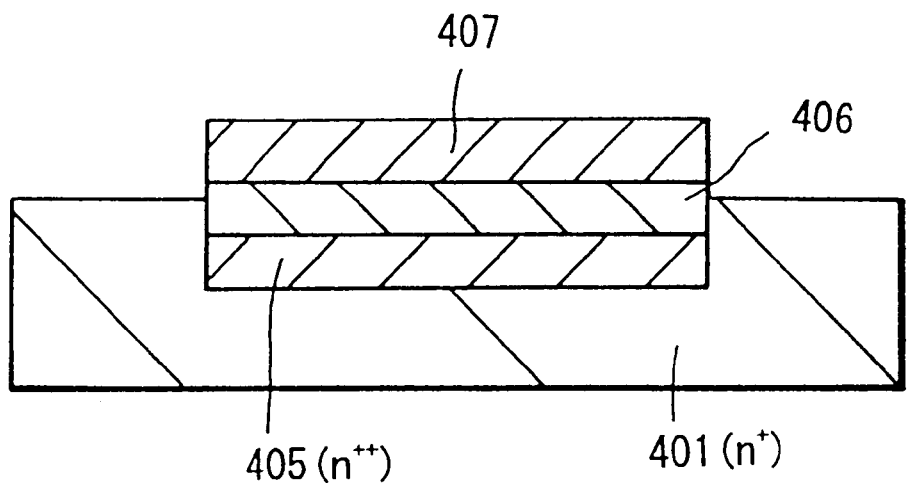

Explained below are embodiments of the invention with reference to the drawings. In the drawings illustrating the embodiments, the same or equivalent portions are labeled with common reference numerals.

FIGS. 5A through 5D illustrate a method for making an ohmic electrode according to the first embodiment of the invention.

Figure 5A:
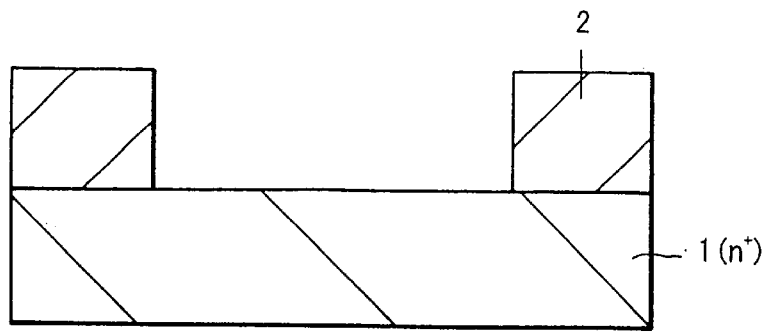
FIGS. 5A through 5D are cross-sectional views for explaining a method for making ohmic electrode according to the first embodiment of the invention.

In the first embodiment, first referring to FIG. 5A, after a photo resist is applied onto an $n^+$-type GaAs substrate 1, the photo resist is patterned by photolithography to form a resist pattern 2 having an opening in a location for the ohmic electrode. For exposure in the photolithography, an optical exposure apparatus, such as reduced projection exposure apparatus (called stepper), is used. For making the resist pattern 2, electron beam resist and electron beam lithography may be used.

Figure 5B:
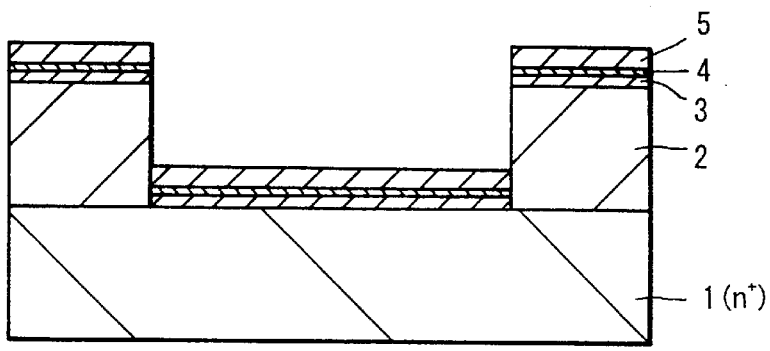

Next referring to FIG. 5B, sequentially formed on the entire substrate surface are a Ni thin film 3, In thin film 4 and Ge thin film 5 by vacuum evaporation of sputtering, for example. The thickness of the resist pattern 2 is chosen to be amply larger than the total thickness of the Ni thin film 3, In thin film 4 and Ge thin film 8. More specifically, thickness of the Ni thin film 3 is from 8 to 30 nm, for example, such as 13 nm; thickness of the In thin film 4 is from 2 nm to 6 nm, such as 5 nm; and thickness of the Ge thin film 5 is from 10 to 50 nm, such as 30 nm.

Figure 5C:
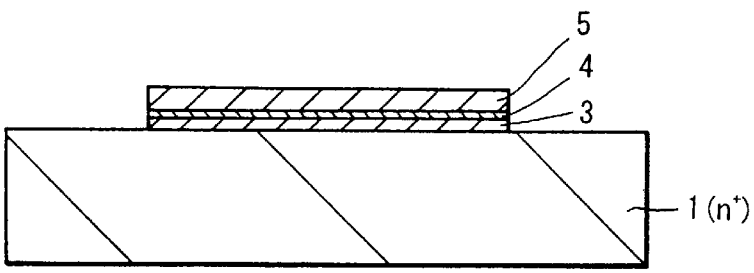

After that, the $n^+$-type GaAs substrate 1 having formed the Ni tin film 3, In thin film 4 and Ge thin film 5 is immersed into an organic solvent such as acetone, and a part of the Ni thin film 3, In thin film 4 and Ge thin film 5 lying on the resist pattern 2 is removed by dissolving the resist pattern 2. As a result, the part f the Ni thin film 3, In thin film 4 and Ge thin film 5 formed in the opening of the resist pattern 2 is maintained on the $n^+$-type GaAs substrate 1 as shown in FIG. 5C.

Figure 5D:
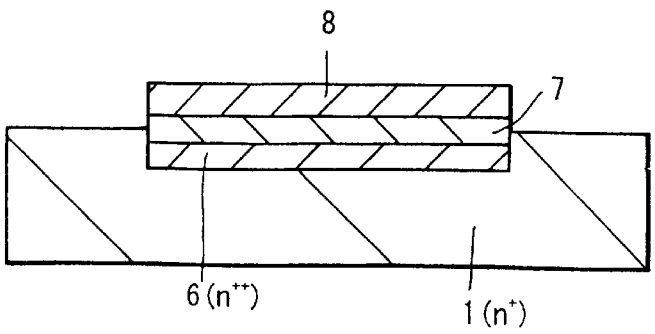

Thereafter, the $n^+$-type GaAs substrate 1 having formed the Ni thin film 3, In thin film 4 and Ge thin film 5 is annealed at a temperature from 300 to 600° C., for example, for a few second to minutes, for example by RTA (rapid thermal annealing) or other typical method using an electric furnace, for example. The annealing results in, as shown in FIG. 5D, re-growing an $n^{++}$-type GaAs layer 6 as a result of diffusion of Ni into a GaAs layer re-grown from the $n^+$-type GaAs substrate 1, forming an InGaAs layer 7 on the $n^{++}$-type GaAs layer 6 as a result of interaction between In and GaAs, and forming a NiGe thin film 8 on the InGaAs layer 7 as a result of Ni and Ge.

In this case, since all of the Ni thin film 3, In thin film 4 and Ge thin film 5 which should interact with each other during annealing are sufficiently thin, only a few amount of Ni, In and Ge is sufficient for reaction, and the depth of reaction with the n$^+$-type GaAs substrate 1 is therefore much shallower than conventional one.

In this manner, the intended ohmic electrode made up of the n$^{++}$-type re-grown GaAs layer 6, InGaAs layer 7 and NiGe thin film 8 is completed.

Figure 6:
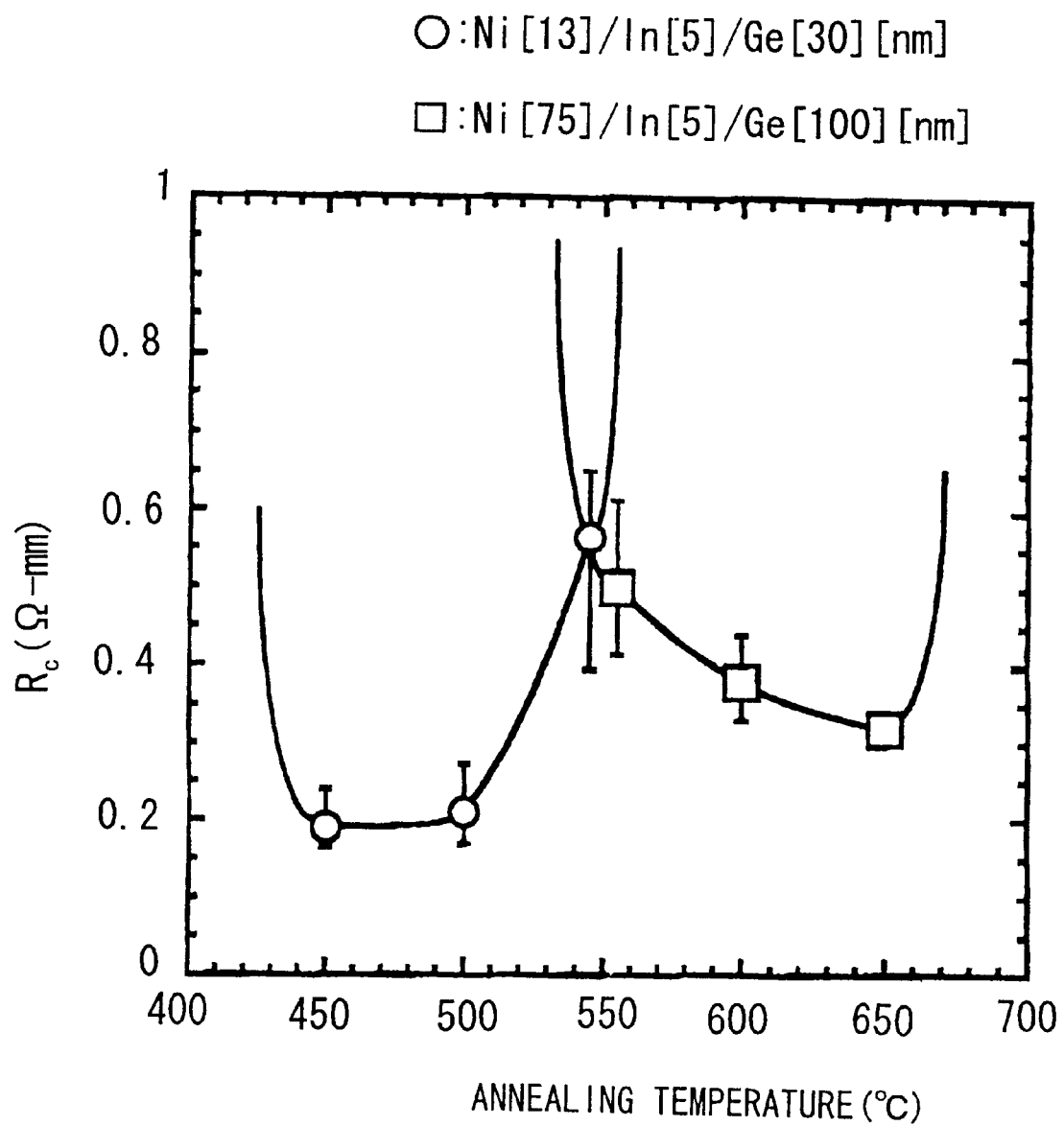
FIG. 6 is a graph showing a result of measurement to confirm how the contact resistance of the ohmic electrode made by the method according to the first embodiment depends upon the annealing temperature.

FIG. 6 shows changes in contact resistance $R_c$ of samples of the ohmic electrode prepared by conducting RTA as the annealing for five seconds at various annealing temperatures. In the samples used for the measurement, the Ni thin film 3 and the Ge thin film 5 were made by electron beam deposition while the In thin film 4 was made by resistance-heating evaporation, and thicknesses of the Ni thin film 3, In thin film 4 and Ge thin film 5 were 13 nm, 5 nm and 30 nm, respectively. For comparison purposes, FIG. 6 also shows changes in contact resistance $R_c$ of samples of the ohmic electrode prepared by changing the annealing temperature and having thicknesses, 75 nm for the Ni thin film 3, 5 nm for the In thin film 4 and 100 nm for the Ge thin film 5.

As apparent from FIG. 6, as compared with the ohmic electrode with 75 nm thick Ni thin film 3, 5 nm thick In thin film 4 and 100 nm thick Ge thin film 5, in the ohmic electrode with the 13 nm thick Ni thin film 3, 5 nm thick In thin film 4 and 30 nm thick Ge thin film 5, the annealing temperature necessary for making the ohmic electrode with a low contact resistance $R_c$ can be lower by approximately 200° C. Additionally, although the minimum value of the contact resistance $R_c$ obtained by making the ohmic electrode to have 75 nm thick Ni thin film 3, 5 nm thick In thin film 4 and 100 nm thick Ge thin film 5 is approximately 0.3 Ω-mm, the minimum value of the contact resistance $R_c$ obtained by making the ohmic electrode to have 13 nm thick Ni thin film 3, 5 nm thick In thin film 4 and 30 nm thick Ge thin film 5 is as low as approximately 0.2 Ω-mm.

Figure 7:
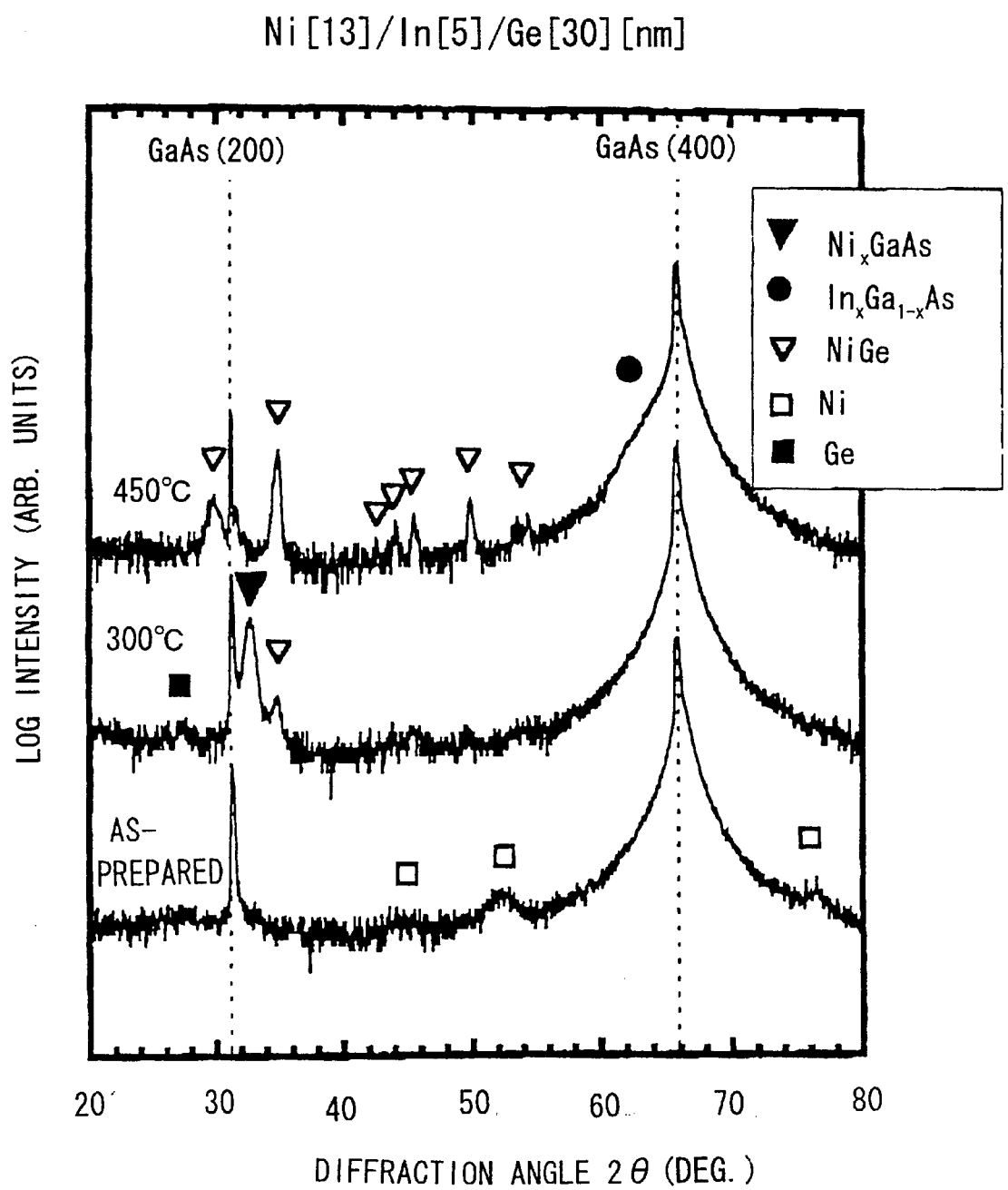
FIG. 7 is a graph showing a result of measurement of X-ray diffraction spectrum of the ohmic electrode made by the method according to the invention.
Figure 8:
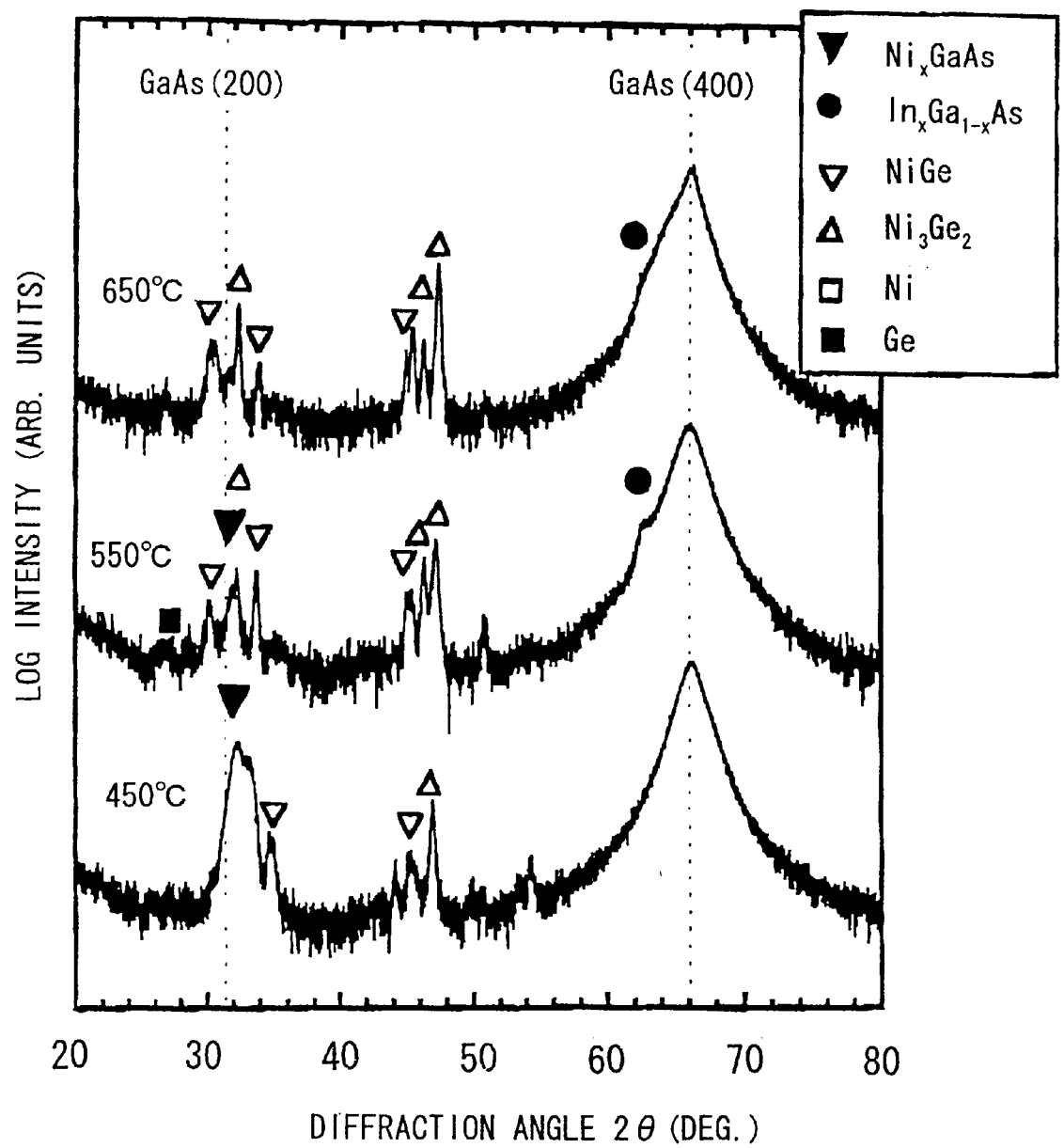
FIG. 8 is a graph showing a result of measurement of X-ray diffraction spectrum of the ohmic electrode prepared for comparison with the ohmic electrode made by the method according to the first embodiment.

FIG. 7 shows a result of X-ray diffraction for identifying reaction products made upon making the ohmic electrode with 13 nm thick Ni thin film 3, 5 nm thick In thin film 4 and 30 nm thick Ge thin film 5. The measurement were made on samples prepared by setting the annealing temperature at 300° C. and 450° C., respectively, just after the Ni thin film 3, In thin film 4 and Ge thin film 5 were made. For comparison purposes, FIG. 8 shows a result of X-ray diffraction for identifying reaction products in the ohmic electrode with 75 nm thick In thin film 3, 5 nm thick Ge In thin film 4 and 100 nm thick Ge thin film 5. The measurement was made on samples prepared by setting the annealing temperatures at 450° C., 550° C. and 650° C., respectively.

By comparing FIG. 7 with FIG. 8, it is confirmed that, in FIG. 8, the InGaAs layer (shown as In$_x$Ga$_{1-x}$As in FIGS. 7 and 8) 7 largely contributing to reduction of the contact resistance $R_c$ is first observed when the annealing temperature reaches or exceeds 550° C., whereas, in FIG. 7, it is observed at a lower annealing temperature, 450° C.

As explained above, according to the first embodiment, by making the Ni thin film 3, In thin film 4 and Ge thin film 5 to form a predetermined pattern on the n$^+$-type GaAs substrate 1, while choosing their thicknesses as sufficiently thin as 8 through 30 nm for the Ni thin film 3, 2 through 6 nm for the In thin film 4 and 10 through 50 nm for the Ge thin film 5, and thereafter annealing them, the ohmic electrode having sequentially stacked n$^{++}$-type re-grown GaAs layer 6, InGaAs layer 7 and NiGe thin film 8 on the n$^+$-type GaAs substrate 1 as shown in FIG. 5D can be obtained. In this case, the annealing temperature can be decreased to as low as 300 through 600° C., which contributes to making the reaction depth much shallower than conventional one and providing a satisfactory process window. Thus, the ohmic electrode is excellent in thermal stability and surface smoothness, and realizes a low contact resistance, low film resistance and short diffusion distance. Moreover, the electrode simplifies its making process, and remarkably excellent as the ohmic electrode for combination with GaAs.

Next explained is the second embodiment of the invention. FIGS. 9A through 9D show a method for making an ohmic electrode according to the second embodiment.

Figure 9A:
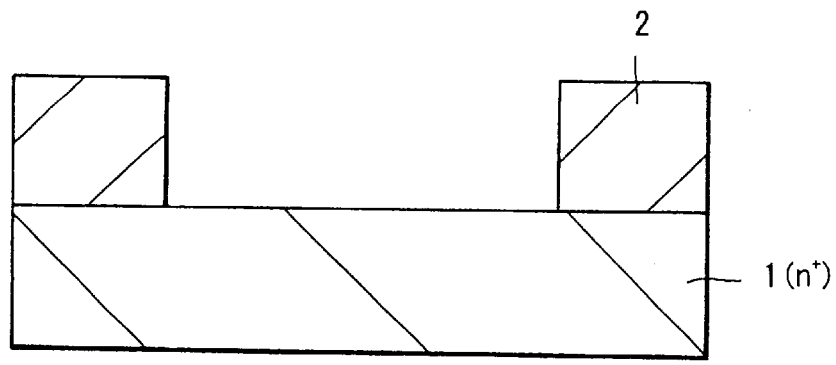
FIGS. 9A through 9D are cross-sectional views for explaining a method for making an ohmic electrode according to the second embodiment of the invention.

In the second embodiment, first referring to FIG. 9A, a resist pattern 2 having an opening in a location for the ohmic electrode is made on the n$^+$-type GaAs substrate 1 in the same manner as the first embodiment.

Figure 9B:
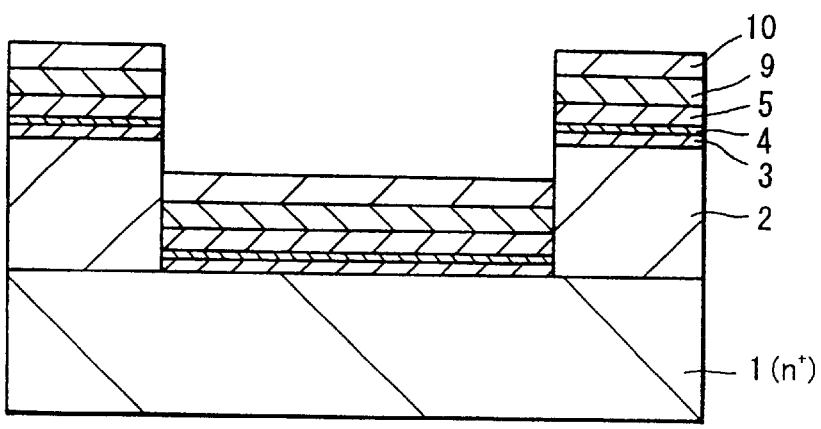
Figure 9C:
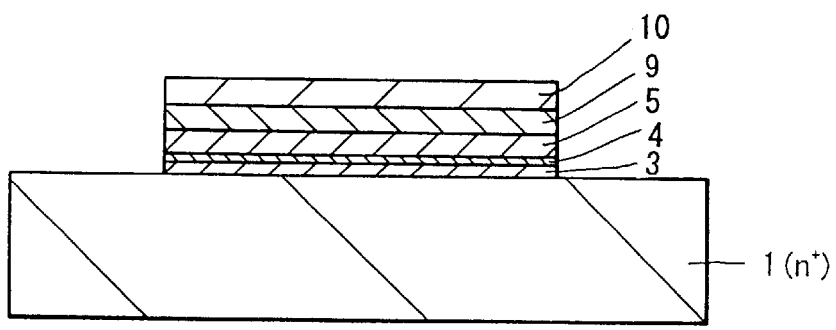

Next referring to FIG. 9B, sequentially formed on the entire substrate surface are the Ni thin film 3, In thin film 4, Ge thin film 5, Nb thin film 9 and Au thin film 10 by vacuum evaporation or sputtering, for example. Thickness of the resist pattern 2 is chosen to be amply larger than the total thickness of the Ni thin film 3, In thin film 4, Ge thin film 5, Nb thin film 9 and Au thin film 10. More specifically, their thicknesses are, for example: 8 through 30 nm, such as 13 nm, for the Ni thin film 3; between 2 nm and 6 nm, such as 5 nm, for the In thin film 4; 10 through 50 nm, such as 30 nm, for the Ge thin film 5; 50 nm for the Nb thin film 9; and 100 nm for the Au thin film 10.

Still in the same manner as the first embodiment, the resist pattern 2 is removed together with the overlying part of the Ni thin film 3, In thin film 4, Ge thin film 5, Nb thin film 9 and Au thin film 10 lying on the resist pattern 2. As a result, as shown in FIG. 5C, the Ni thin film 3, In thin film 4, Ge thin film 5, Nb thin film 9 and Au thin film 10 are maintained only on the selected portion of the n$^+$-type GaAs substrate 1 corresponding to the opening of the resist pattern 2.

Figure 9D:
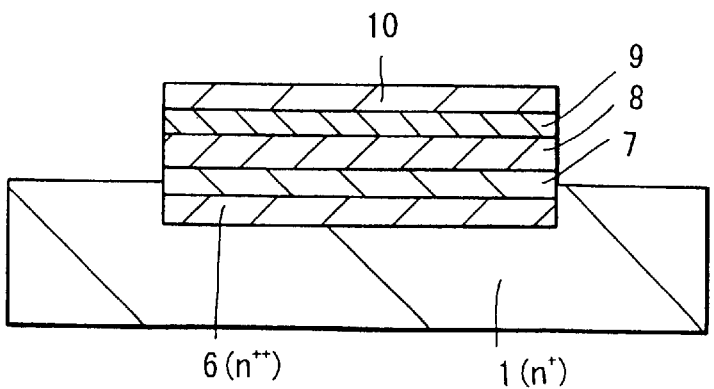

After that, the n$^+$-type GaAs substrate 1 having formed the Ni thin film 3, In thin film 4, Ge thin film 5, Nb thin film 9 and Au thin film 10 is annealed in the same manner as the first embodiment. The annealing results in, as shown in FIG. 9D, re-growing an n$^{++}$-type GaAs layer 6 as a result of diffusion of Ni into a GaAs layer re-grown from the n$^+$-type GaAs substrate 1, forming an InGaAs layer 7 on the n$^{++}$-type GaAs layer 6 as a result of interaction between In and GaAs, and forming a NiGe thin film 8 on the InGaAs layer 7 as a result of Ni and Ge. On the other hand, since the Nb thin film 9 on the Ge thin film 5 has a very high melting point as high as 2468° C., it does not interact with Ni, In or Ge. Therefore, the Au thin film 10 on the Nb thin film 9 is also prevented from interaction with Ni, In or Ge, and it is maintained as it is.

In this case, since all of the Ni thin film 3, In thin film 4 and Ge thin film 5 which should interact with each other during annealing are sufficiently thin, only a few amount of Ni, In and Ge is sufficient for reaction, and the depth of reaction with the n$^+$-type GaAs substrate 1 is therefore much shallower than conventional one.

In this manner, the intended ohmic electrode made up of the n$^{++}$-type re-grown GaAs layer 6, InGaAs layer 7, NiGe thin film 8, Nb thin film 9 and Au thin film 10 is completed.

Figure 10:
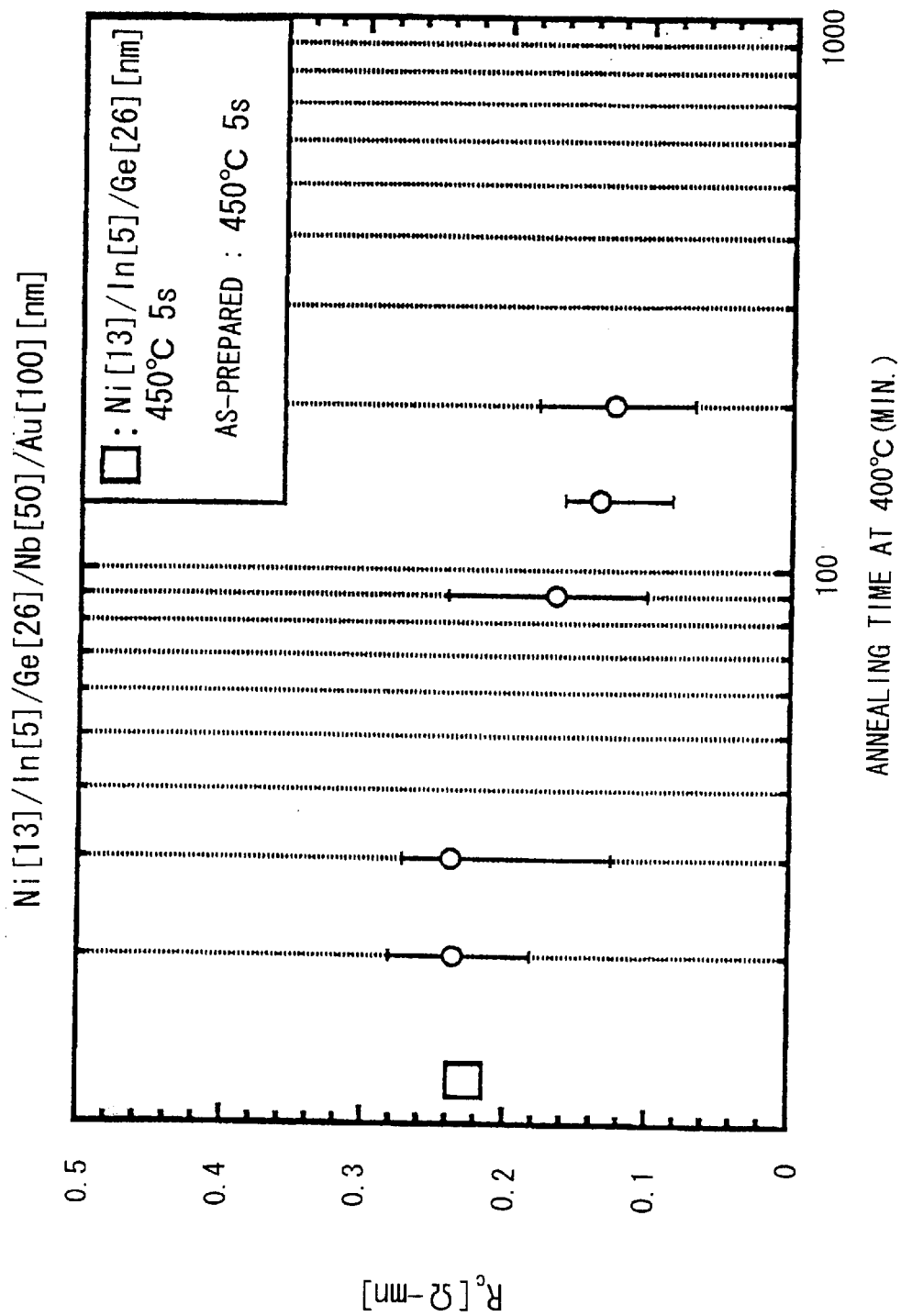
FIG. 10 is a graph showing a result of measurement of thermal stability of the ohmic electrode made by the method according to the second embodiment.

FIG. 10 shows a result of measurement of changes with time in contact resistance $R_c$ of the ohmic electrode, that is, thermal reliability of the ohmic electrode, on samples prepared by first making the ohmic electrode by the method according to the first embodiment by RTA at 450° C. for five seconds and then annealing at 400° C. In the samples used for the measurement, the Ni thin film 3, Ge thin film 5 and Nb thin film 9 were made by electron beam deposition while the In thin film 4 and the Au thin film 10 were made by resistance-heating evaporation, and thicknesses of the Ni thin film 3, In thin film 4, Ge thin film 5, Nb thin film 9 and Au thin film 10 were 13 nm, 5 nm, 26 nm, 50 nm and 100 nm, respectively. For comparison purposes, FIG. 10 also shows changes in contact resistance $R_c$ of samples of the ohmic electrode prepared by first sequentially forming the Ni thin film 3, In thin film 4 and Ge thin film 5 on the $n^+$-type GaAs substrate 1 and annealing them at 450° C. for five seconds by RTA. As apparent from FIG. 10, even when annealing at 400° C. for two hours is conducted to the ohmic electrode after being made, no substantial change is observed in contact resistance $R_c$, and the ohmic electrode maintains the contact resistance value of approximately 0.2 $\Omega$-mm.

As explained above, according to the second embodiment, by making the Ni thin film 3, In thin film 4, Ge thin film 5, Nb thin film 9 and Au thin film 10 to form a predetermined pattern on the $n^+$-type GaAs substrate 1, while choosing their thicknesses as sufficiently thin as 8 through 30 nm for the Ni thin film 3, 2 through 6 nm for the In thin film 4 and 10 through 50 nm for the Ge thin film 5, and thereafter annealing them, the ohmic electrode having sequentially stacked $n^{++}$-type re-grown GaAs layer 6, InGaAs layer 7, NiGe thin film 8, Nb thin film 9 and Au thin film 10 on the $n^+$-type GaAs substrate 1 as shown in FIG. 9D can be obtained. In this case, the annealing temperature can be decreased to as low as 300 through 600° C., which contributes to making the reaction depth much shallower than conventional one and providing a satisfactory process window. Thus, the ohmic electrode is excellent in thermal stability and surface smoothness, and realizes a low contact resistance, low film resistance and short diffusion distance. Moreover, the electrode simplifies its making process, and remarkably excellent as the ohmic electrode for combination with GaAs. Especially, the Nb thin film 9 prevents undesirable deposition of In onto the electrode surface, the surface morphology of the ohmic electrode is very good.

Next explained is the third embodiment of the invention. FIGS. 11A through 11D show a method for making an ohmic electrode according to the third embodiment.

Figure 11A:
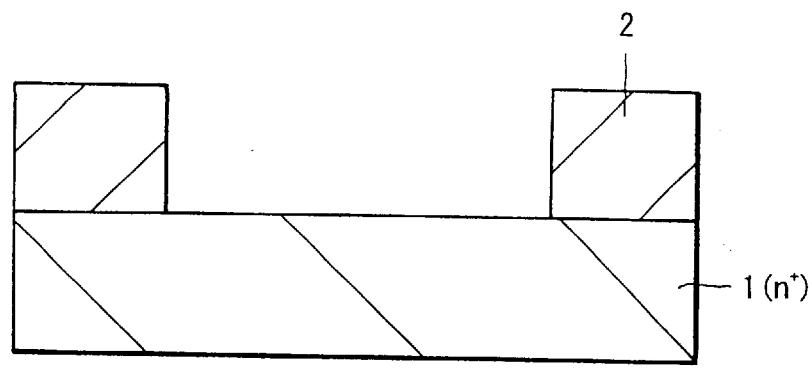
FIGS. 11A through 11D are cross-sectional views for explaining a method for making an ohmic electrode according to the third embodiment of the invention.

In the third embodiment, first referring to FIG. 11A, a resist pattern 2 having an opening in a location for the ohmic electrode is made on the $n^+$-type GaAs substrate 1 in the same manner as the first embodiment.

Figure 11B:
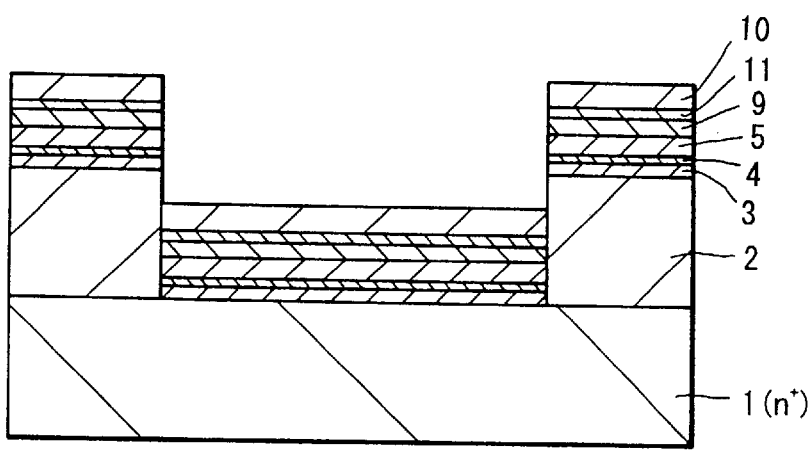
Figure 11C:
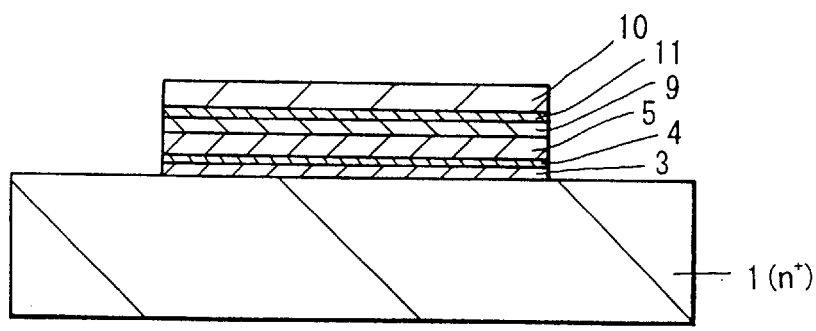

Next referring to FIG. 11B, sequentially formed on the entire substrate surface are the Ni thin film 3, In thin film 4, Ge thin film 5, Nb thin film 9, Ti thin film 11 and Au thin film 10 by vacuum evaporation or sputtering, for example. Thickness of the resist pattern 2 is chosen to be amply larger than the total thickness of the Ni thin film 3, In thin film 4, Ge thin film 5, Nb thin film 9, Ti thin film 11 and Au thin film 10. More specifically, their thicknesses are, for example: 8 through 30 nm, such as 13 nm, for the Ni thin film 3; between 2 nm and 6 nm, such as 5 nm, for the In thin film 4; 10 through 50 nm, such as 30 nm, for the Ge thin film 5; 50 nm for the Nb thin film 9; 20 nm for the Ti thin film 11; and 100 nm for the Au thin film 10.

Figure 11D:
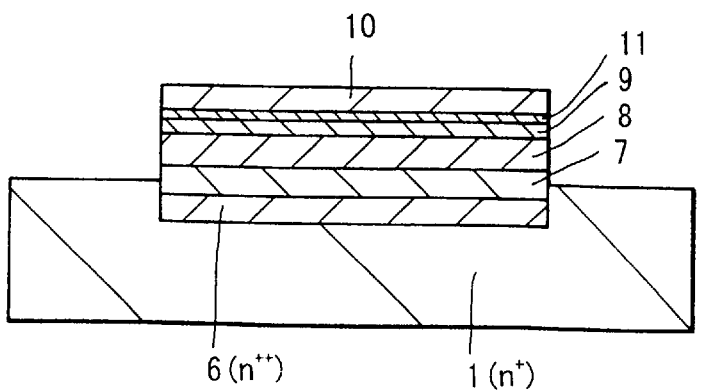

Still in the same manner as the first embodiment, the $n^+$-type GaAs substrate 1 having formed the Ni thin film 3, In thin film 4, Ge thin film 5, Nb thin film 9, Ti thin film 11 and Au thin film 10 is annealed. The annealing results in, as shown in FIG. 11D, re-growing an $n^{++}$-type GaAs layer 6 as a result of diffusion of Ni into a GaAs layer re-grown from the $n^+$-type GaAs substrate 1, forming an InGaAs layer 7 on the $n^{++}$-type GaAs layer 6 as a result of interaction between In and GaAs, and forming a NiGe thin film 8 on the InGaAs layer 7 as a result of Ni and Ge. On the other hand, since the Nb thin film 9 and the Ti thin film 11 on the Ge thin film 5 have very high melting points as high as 2468° C. and 1998° C., respectively, they do not interact with Ni, In or Ge. Therefore, the Au thin film 10 above the Nb thin film 9 and the Ti thin film 11 is also prevented from interaction with Ni, In or Ge, and it is maintained as it is.

In this case, since all of the Ni thin film 3, In thin film 4 and Ge thin film 5 which should interact with each other during annealing are sufficiently thin, only a few amount of Ni, In and Ge is sufficient for reaction, and the depth of reaction with the $n^+$-type GaAs substrate 1 is therefore much shallower than conventional one.

In this manner, the intended ohmic electrode made up of the $n^{++}$-type re-grown GaAs layer 6, InGaAs layer 7, NiGe thin film 8, Nb thin film 9, Ti thin film 11 and Au thin film 10 is completed.

According to the third embodiment, in addition to the same advantages as those of the second embodiment, there is obtained a further advantage that two-layered refractory metal thin films, namely, Nb thin film 9 and Ti thin film 11, made on the Ge thin film 5 more reliably prevents undesirable deposition of In onto the electrode surface.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, numerical values, structures and processes raised in the first, second and third embodiments are not but examples, and other appropriate numerical values, structures and processes may be used, if necessary.

More specifically, in the method for making an ohmic electrode explained with the first embodiment, the Ni thin film 3, In thin film 4 and Ge thin film 5 in form of the ohmic electrode were made by so-called lift-off. However, these films in form of the ohmic electrode may be made by first sequentially stacking the Ni thin film 3, In thin film 4 and Ge thin film 5 on the entire surface of the $n^+$-type GaAs substrate 1 and thereafter patterning them into the form of the ohmic electrode by etching. This applies also to the second and third embodiments.

Although the first, second and third embodiments have been explained as applying the invention to an ohmic electrode for combination with the $n^+$-type GaAs substrate 1, the invention is applicable also to an ohmic electrode in combination with an $n^+$-type GaAs layer made by epitaxial growth, for example.

As described above, the ohmic electrode according to the invention promises realization of an ohmic electrode having more satisfactory practical characteristics relative to III–V compound semiconductor base bodies.

The method for making an ohmic electrode according to the invention promises easier fabrication of an ohmic electrode having more satisfactory practical characteristics relative to III–V compound semiconductor base bodies.

The multi-layered structure for making an ohmic electrode according to the invention promises easier fabrication of an ohmic electrode having more satisfactory practical characteristics relative to III–V compound semiconductor base bodies.

What is claimed is:

1. An ohmic electrode made by sequentially forming a Ni thin film with a thickness between 8 nm and 30 nm, an In thin film with a thickness between 2 nm and 6 nm and a Ge thin film with a thickness between 10 nm and 50 nm on a III–V compound semiconductor base body, and thereafter annealing said III–V compound semiconductor base body having formed said Ni thin film, said In thin film and said Ge thin film.

2. The ohmic electrode according to claim 1 wherein thickness of said Ni thin film is not thinner than 10 nm and not thicker than 20 nm, thickness of said In thin film is not thinner than 3 nm and not thicker than 5 nm, and thickness of said Ge thin film is not thinner than 20 nm and not thicker than 40 nm.

3. The ohmic electrode according to claim 1 wherein temperature for the annealing is not lower than 300° C. and not higher than 600° C.

4. The ohmic electrode according to claim 1 wherein said III–V compound semiconductor base body is of a n-type.

5. The ohmic electrode according to claim 1 wherein said III–V compound semiconductor base body is made of GaAs, AlGaAs or InGaAs.

6. The ohmic electrode according to claim 1 wherein said ohmic electrode is made by further forming a thin film of a refractory metal or a refractory metal compound on said Ge thin film and thereafter annealing said III–V compound semiconductor base body having formed said Ni thin film, said In thin film, said Ge thin film and said thin film of a refractory metal or refractory metal compound.

7. The ohmic electrode according to claim 6 wherein said refractory metal or said refractory metal compound has a melting point not lower than 800° C.

8. The ohmic electrode according to claim 6 wherein said refractory metal is Nb, W, Ta, Ti or Mo.

9. The ohmic electrode according to claim 6 wherein said refractory metal compound is a nitride or a silicon compound of a refractory metal.

10. The ohmic electrode according to claim 6 wherein said thin film of a refractory metal or refractory metal compound is a Nb thin film and a Ti thin film thereon.

11. The ohmic electrode according to claim 1 wherein said ohmic electrode is made by further forming a thin film of a refractory metal or refractory metal compound and a thin film of a metal or a metal compound sequentially on said Ge thin film, and thereafter annealing said III–V compound semiconductor base body having formed said Ni thin film, said In thin film, said Ge thin film, said thin film of a refractory metal or refractory metal compound and said thin film of a metal or metal compound.

12. The ohmic electrode according to claim 11 wherein said refractory metal or said refractory metal compound has a melting point not lower than 800° C.

13. The ohmic electrode according to claim 11 wherein said refractory metal is Nb, W, Ta, Ti or Mo.

14. The ohmic electrode according to claim 11 wherein said refractory metal compound is a nitride or a silicon compound of a refractory metal.

15. The ohmic electrode according to claim 11 wherein said thin film of a refractory metal or refractory metal compound is made up of a Nb thin film and a Ti thin film thereon.

16. The ohmic electrode according to claim 11 wherein said metal or metal compound is Al, Au, Cu or an Al alloy.

17. A multi-layered structure for making an ohmic electrode, comprising a Ni thin film with a thickness between 8 nm and 30 nm, an In thin film with a thickness between 2 nm and 6 nm and a Ge thin film with a thickness between 10 nm and 50 nm which are sequentially formed on a III–V compound semiconductor base body.

18. The multi-layered structure for making an ohmic electrode according to claim 17 wherein thickness of said Ni thin film is not thinner than 10 nm and not thicker than 20 nm, thickness of said In thin film is not thinner than 3 nm and not thicker than 5 nm, and thickness of said Ge thin film is not thinner than 20 nm and not thicker than 40 nm.

19. The multi-layered structure for making an ohmic electrode according to claim 17 wherein said III–V compound semiconductor base body is of an n-type.

20. The multi-layered structure for making an ohmic electrode according to claim 17 wherein said III–V compound semiconductor base body is made of GaAs, AlGaAs or InGaAs.

21. The multi-layered structure for making an ohmic electrode according to claim 17 wherein a thin film of a refractory metal or a refractory metal compound is further formed on said Ge thin film.

22. The multi-layered structure for making an ohmic electrode according to claim 21 wherein said refractory metal or said refractory metal compound has a melting point not lower than 800° C.

23. The multi-layered structure for making an ohmic electrode according to claim 21 wherein said refractory metal is Nb, W, Ta, Ti or Mo.

24. The multi-layered structure for making an ohmic electrode according to claim 21 wherein said refractory metal compound is a nitride or a silicon compound of a refractory metal.

25. The multi-layered structure for making an ohmic electrode according to claim 21 wherein said thin film of a refractory metal or refractory metal compound is a Nb thin film and a Ti thin film thereon.

26. The multi-layered structure for making an ohmic electrode according to claim 17 wherein a thin film of a refractory metal or refractory metal compound and a thin film of a metal or a metal compound are further formed sequentially on said Ge thin film.

27. The multi-layered structure for making an ohmic electrode according to claim 26 wherein said refractory metal or said refractory metal compound has a melting point not lower than 800° C.

28. The multi-layered structure for making an ohmic electrode according to claim 26 wherein said refractory metal is Nb, W, Ta, Ti or Mo.

29. The multi-layered structure for making an ohmic electrode according to claim 26 wherein said refractory metal compound is a nitride or a silicon compound of a refractory metal.

30. The multi-layered structure for making an ohmic electrode according to claim 26 wherein said thin film of a refractory metal or refractory metal compound is made up of a Nb thin film and a Ti thin film thereon.

31. The multi-layered structure for making an ohmic electrode according to claim 26 wherein said metal or metal compound is Al, Au, Cu or an Al alloy.

* * * * *